United States Patent [19]

Odom

[11] Patent Number: 5,796,963
[45] Date of Patent: Aug. 18, 1998

[54] SYSTEM AND METHOD FOR CONVERTING VXI BUS CYCLES TO PCI BURST CYCLES

[75] Inventor: B. Keith Odom, Pflugerville, Tex.

[73] Assignee: National Instruments Corporation, Austin, Tex.

[21] Appl. No.: 648,880

[22] Filed: May 16, 1996

[51] Int. Cl.$^6$ .................................................. H01J 13/00
[52] U.S. Cl. .......................... 395/308; 395/307; 395/500
[58] Field of Search ................................. 395/306, 307, 395/308, 309, 285, 500, 527, 287, 878, 880, 881

[56] References Cited

U.S. PATENT DOCUMENTS

| 5,388,231 | 2/1995 | Starr | 395/307 |
| 5,434,996 | 7/1995 | Bell | 395/550 |
| 5,455,916 | 10/1995 | Bourke et al. | 395/285 |
| 5,524,270 | 6/1996 | Haess et al. | 395/880 |
| 5,574,869 | 11/1996 | Young et al. | 395/306 |
| 5,596,731 | 1/1997 | Martinez, Jr. et al. | 395/309 |
| 5,627,998 | 5/1997 | Mondrik et al. | 395/500 |
| 5,652,848 | 7/1997 | Bui et al. | 395/309 |
| 5,664,117 | 9/1997 | Shah et al. | 395/280 |
| 5,664,122 | 9/1997 | Rabe et al. | 395/308 |

Primary Examiner—Jack B. Harvey
Assistant Examiner—Raymond N. Phan
Attorney, Agent, or Firm—Conley, Rose & Tayon; Jeffrey C. Hood

[57] ABSTRACT

A system and method for converting VXI block transfer cycles to PCI burst cycles. The present invention may also be generalized to convert between any of various types of buses which use block transfer cycles and burst cycles. A bus bridge or interface unit is coupled between a VXI bus and a PCI bus. The bus bridge includes a VXI to PCI adapter for converting VXI block cycles to PCI burst cycles. The bus bridge includes a buffer which receives VXI block transfer cycles and stores the VXI cycles. The bus bridge also includes control circuitry which tags data in the received VXI block transfer cycles in order to identify and separate different VXI block transfers. Once all the cycles of a given data transfer have been tagged, they are transferred along the PCI bus as a PCI burst cycle.

15 Claims, 3 Drawing Sheets

SYSTEM AND METHOD FOR CONVERTING VXI BUS CYCLES TO PCI BURST CYCLES

FIELD OF THE INVENTION

The present invention relates to systems having two or more interconnected buses and more particularly to a system and method for interfacing a VXI bus based system to a PCI bus based system and which converts VXI block cycles to PCI burst cycles.

DESCRIPTION OF THE RELATED ART

Personal computers typically include one or more expansion buses to provide upgradable expansion options for the user. For example, the personal computer architecture includes various types of system/memory buses and expansion buses. One computer system expansion bus currently in use is referred to as the peripheral component interconnect (PCI) bus. The PCI bus is a high speed bus which is local to the main CPU. The PCI bus supports burst cycles whereby multiple data portions are transferred consecutively. In a PCI bus burst transfer, the PCI device first outputs a beginning address, followed by a plurality of data portions comprising the transfer.

Modern instrumentation systems generally include a personal computer system which interfaces to one or more real world instruments through various hardware interface options. The various hardware interface options include the general purpose interface bus (GPIB), the VXI (VME Extensions for Instrumentation) bus, serial or RS-232 connections or a data acquisition card inserted into an expansion slot of the computer system which interfaces to one or more transducers or sensors.

The VXI bus is perhaps the fastest growing hardware interface option for instrumentation and test and measurement applications. A VXI system typically includes a VXI chassis having a VXI backplane and which is adapted to receive VXI modules or add-in cards. VXI hardware developers are currently developing various types of VXI modules for instrumentation applications. Due to the increasingly wide acceptance of the PCI standard, it is desirable to provide for connecting VXI instrumentation modules, to computer systems employing the PCI bus.

One problem with interfacing the VXI bus or VME bus to a PCI bus is that the VXI bus and VME bus use an asynchronous block transfer protocol at a rate provided by the sender. Thus, the end of a given data transfer does not necessarily mean the end of a cycle. However, the PCI bus transfers data synchronously and at a fixed rate. Thus, it has been difficult to interface the VXI bus to the PCI bus because the system must ensure that the end of a VXI transfer can be identified in order to convert it to a single PCI burst transfer. Therefore, an improved system and method is desired for converting between VXI block cycles and PCI burst cycles.

SUMMARY OF THE INVENTION

The present invention comprises a system and method for converting VXI block transfer cycles to PCI burst cycles. This allows optimum use of VXI block cycles with PCI burst cycles. The present invention may also be generalized to convert between any of various types of buses which use block transfer cycles and burst cycles.

In one embodiment, the present invention comprises a bus bridge or interface unit coupled between a VXI bus and a PCI bus. The bus bridge includes a VXI to PCI adapter for converting VXI block cycles to PCI burst cycles. The bus bridge includes a buffer which receives VXI block transfer cycles and stores the VXI cycles. The bus bridge also includes control circuitry which tags data in the received VXI block transfer cycles in order to identify and separate different VXI block transfers. As the cycles of a given data transfer are tagged, PCI burst cycles are initiated, and the tagged data is transferred along the PCI bus as a PCI burst cycle.

A method according to the present invention comprises generating a plurality of VXI block cycles which transfer data on the VXI bus, wherein the plurality of VXI block cycles use a block transfer protocol. The data transferred on the plurality of VXI bus cycles are asynchronous and are transferred at a variable rate. The plurality of VXI block cycles includes two or more sets of block cycles comprising data and corresponding to respective block transfers. The bus bridge receives the plurality of VXI block cycles from the VXI bus and stores the transferred data in a buffer. The bus bridge examines the captured data from the plurality of VXI block cycles and tags each set of block cycles with a respective address identifier. Each set of block cycles is then transferred on the PCI bus with the respective address identifier using a respective PCI burst cycle.

More generally, the present invention relates to a system and method for converting data from one transfer format on a first bus to another transfer format on a second bus. The data are received from the first bus and captured in a buffer. The captured data may correspond to two or more different block transfer cycles. Data from respective different block transfer cycles are then tagged. Data of the same block are then transferred along the second bus in the second bus format.

BRIEF DESCRIPTION OF THE DRAWINGS

A better understanding of the present invention can be obtained when the following detailed description of the preferred embodiment is considered in conjunction with the following drawings in which.

Figure 1:
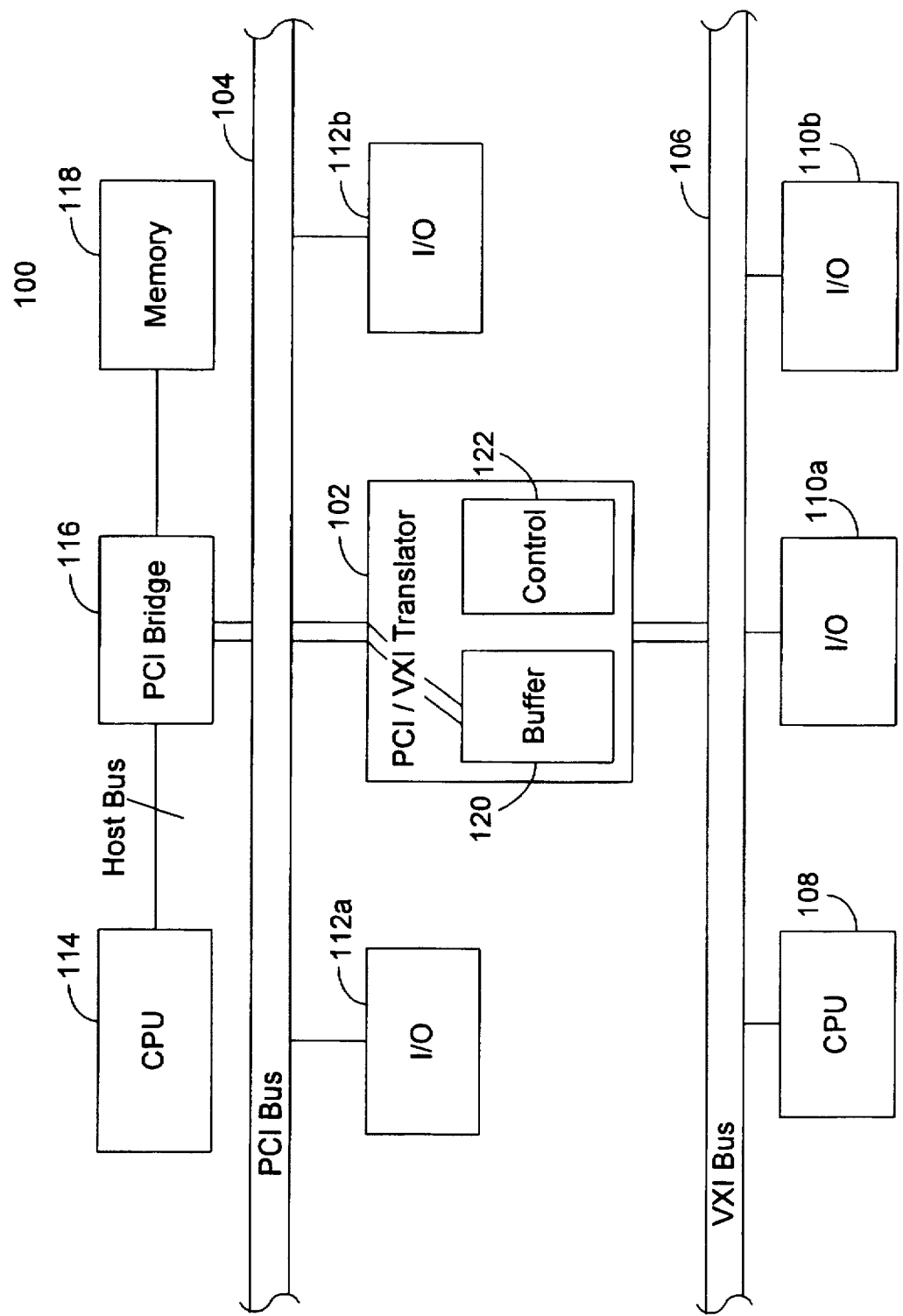
FIG. 1 illustrates a computer system in accordance with the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary the intention is to cover all modifications equivalents and alternatives solely within the spirit and scope of the present invention, as defined by the appended claims.

INCORPORATION BY REFERENCE

Applicant hereby incorporates by reference, in their entirety, the following documents:

The PCI bus specification, available from Intel Corporation.

The VME bus specification, IEEE standard 1014–1987, titled "IEEE Standard for a Versatile Backplane Bus: VME Bus," and subsequent versions, are hereby incorporated by reference.

DETAILED DESCRIPTION OF THE INVENTION

The present invention comprises a system and method for converting a bus cycle of one type to a bus cycle of a second type. More particularly, the present invention relates to a system and method for converting VXI block bus cycles to PCI burst cycles.

Background on the VME bus and VXI bus is deemed appropriate. The VME bus accommodates read, write, block-read, block-write, read-modify-write, address only, and interrupt acknowledge data transfer bus cycles. During a read cycle, the VME bus may transfer one, two, three or four bytes. A bus master will broadcast an address and address modifier which each slave will capture and check to see if it is to respond to the cycle. If so, the slave will retrieve the data and place the data on the data bus thereafter acknowledging the transfer. The bus master will then terminate the cycle. Similarly, during a write cycle, a bus master will broadcast an address and address modifier. Each bus slave will capture the address and modifier and check to see if it is to respond to the cycle. If so, the target slave will store the data and acknowledge the transfer. The bus master will then terminate the cycle. During a read-modify-write cycle, a slave location may be read to and written to while permitting no other bus master to access that location. During an address-only cycle, no data is transferred. Bus slaves do not acknowledge the cycle and the bus master can terminate the cycle without waiting for an acknowledgment. The interrupt acknowledged cycle is used when an interrupt handler detects an interrupt request from an interrupt and has control of the bus.

A block-read cycle is a cycle used to transfer a block of between 1 to 256 bytes of data from a slave to a bus master using a string of 1, 2 or 4-byte data transfers. Once the block transfer is started, the bus master does not release the bus until all of the bytes have been transferred. Unlike a string of read cycles, the bus master broadcasts only one address and address modifier at the beginning of the cycle. The slave then increments the address on each transfer so that the data for the next transfer is retrieved from the next higher location. Similarly, during a block-write cycle, a master can transfer a block of 1 to 256 bytes of data to a slave. The master uses a string of 1, 2, or 4-byte data transfers. Again, the master does not release the bus until all of the bytes have been transferred.

The VME data transfer bus employs a plurality of control lines to control the movement of data. Among these are an address strobe and two data transfer strobes (data strobe 0 and data strobe 1). A falling edge on the address strobe indicates to a slave device that the address is stable and can be captured. The data strobe 0 and data strobe 1 lines are used, inter alia, during a write cycle to indicate when the master has placed valid data on the bus. The data strobes are used on read cycles to indicate to a slave when it can remove valid data from the bus. Data strobe 0 and data strobe 1 signal lines are also used to select byte locations in a process that is not of relevance here.

The VME bus block transfer will now be described in greater detail: When a bus master initiates the block transfer, a responding slave will latch the address into an on-board address counter. When the master completes the first data transfer by driving the data strobes high, the master will repeatedly drive the data strobe low in response to data transfer acknowledgments from the slave and thereby transfer data to or from sequential memory locations in ascending order. To access the next location, the slave will increment the on-board counter that generates the address for each transition of each data strobe. The bus master does not drive the address strobe high until the end of the block transfer. The same bus master may immediately initiate another block transfer to another slave. The block transfer proceeds in a manner similar to that discussed above. The address strobe is again held low while the data strobe is driven repeatedly to complete the block cycles. When the block transfer is done, the address strobe is again driven high.

The maximum length of block transfers on the VME bus is 256 bytes. When it is necessary to transfer a block of data larger than 256 bytes, hardware may be provided to recognize the arrival of more than 256 bytes and then drive the address strobe high initiating another block transfer without the intervention of system software.

PCI bus data transfers are called burst transfers. Each burst transfer includes an address phase and a data phase. During the address phase, the beginning address and transfer identifier are set. During the data phase, or phases, a plurality of 32-bit or 64-bit consecutive transfers are made. Every transfer on the PCI bus is synchronized to a PCI clock. The address phase of a data transfer is one PCI clock in duration. Only a start address is provided during each subsequent data transfer the receiving device ought increments the addresses. A PCI bus master will also indicate the amount of data to be transferred. The duration of the burst transfer is determined using a framing signal which is asserted at the beginning of the address phase and remains asserted until the last data phase.

FIG. 1 illustrates a computer system in accordance with one embodiment of the present invention. Computer system 100 includes a CPU 114 coupled to a PCI bridge 116, which in turn is coupled to a memory 118 and also to the PCI bus 104. A variety, of peripheral devices 112a, 112b are coupled to the PCI bus. The system also includes a VXI bus 106. In an alternate embodiment, the bus 106 is the VME bus. A PCI/VXI bus translator 102 intercouples PCI bus 104 with VXI bus 106. A CPU 108 and a variety of peripherals 110a, 110b may be coupled to VXI bus 106.

PCI/VXI bus translator 102 includes a buffer 120 and a control unit 122. VXI bus cycles transferred from VXI bus 106 are captured in buffer 120, which may be a FIFO buffer, and stored until bursted to PCI bus 104. Control unit 122 applies a tag to identify each VXI bus 106 block transfer as a part of one or more PCI bus burst transfers. More particularly, turning now to FIG. 2, PCI/VXI bus translator 102 is shown in greater detail. Buffer 120 includes address 202 and data 204 portions. Control unit 122 notes the reception of incoming data and applies a tag to the beginning of each VXI bus block cycle. This tag may be responsive, for example, to the detection of a new assertion of the VXI bus address strobe. Thus, for example, in FIG. 2, a tag A has been applied to the cycle identified by the numeral 206. Control unit 122 identifies an initial address (in the present example XXX). Since only the initial address is provided, control unit 122 applies the same tag to subsequent cycles until a new address (in the present example YYY) representative of a new VXI bus block transfer 208 is received. The tag B has been applied to the data in the new VXI block. Again, the same tag B is applied to subsequent transfers until a new address, ZZZ, is received, in which case the tag A is again applied. It should be noted that each data transfer may be assigned its own unique tag. However, if a FIFO buffer is used, only alternating tags are required. It should further be noted that the tag, which may be a PCI bus address identifier, need only be applied to the beginning of each VXI block cycle. Control unit 122 may additionally be configured to provide information on PCI bus 104 concerning the length of each burst.

Figure 2:
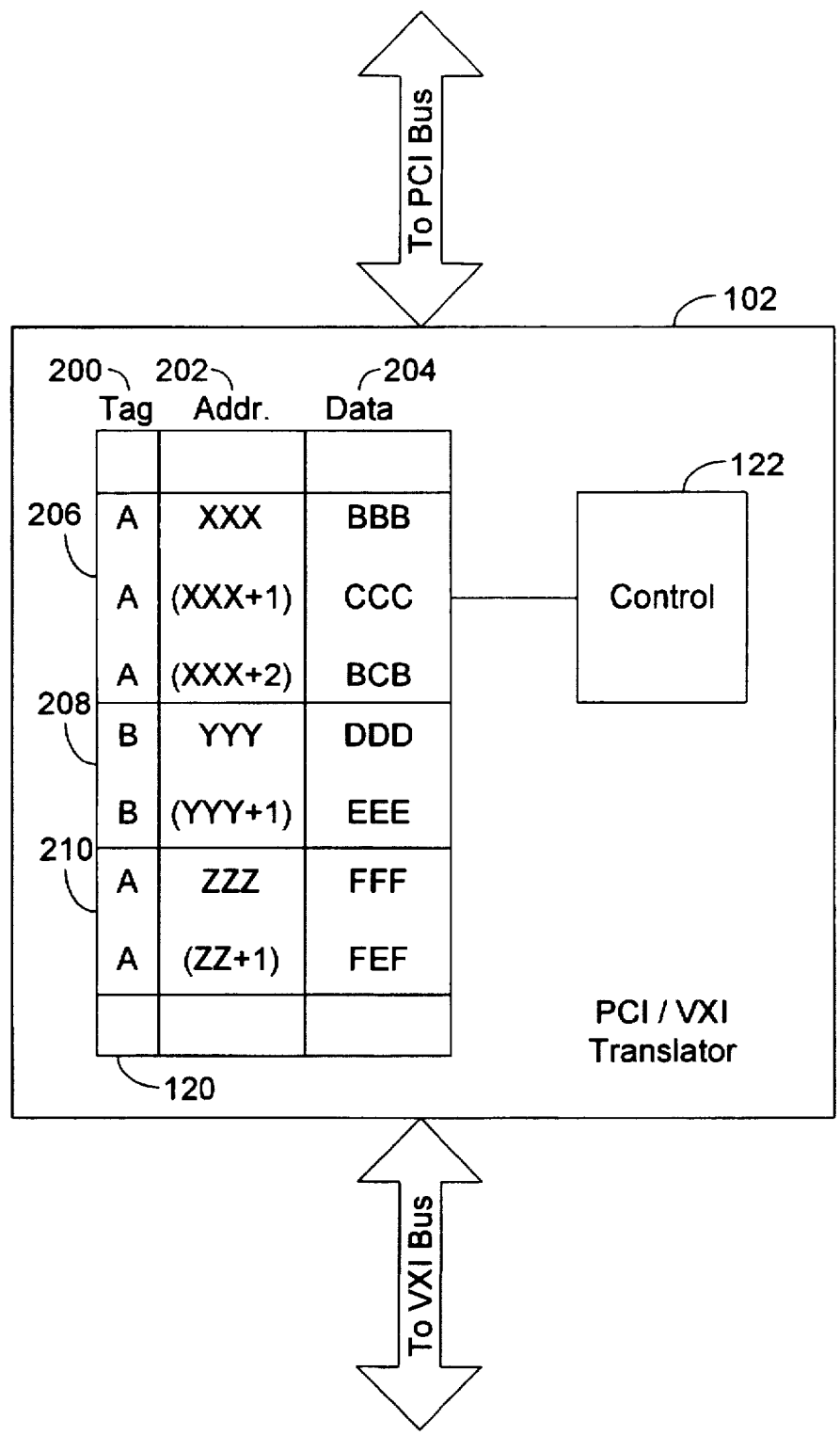
FIG. 2 illustrates a VXI-PCI bus translator in accordance with the claimed invention.
Figure 3:
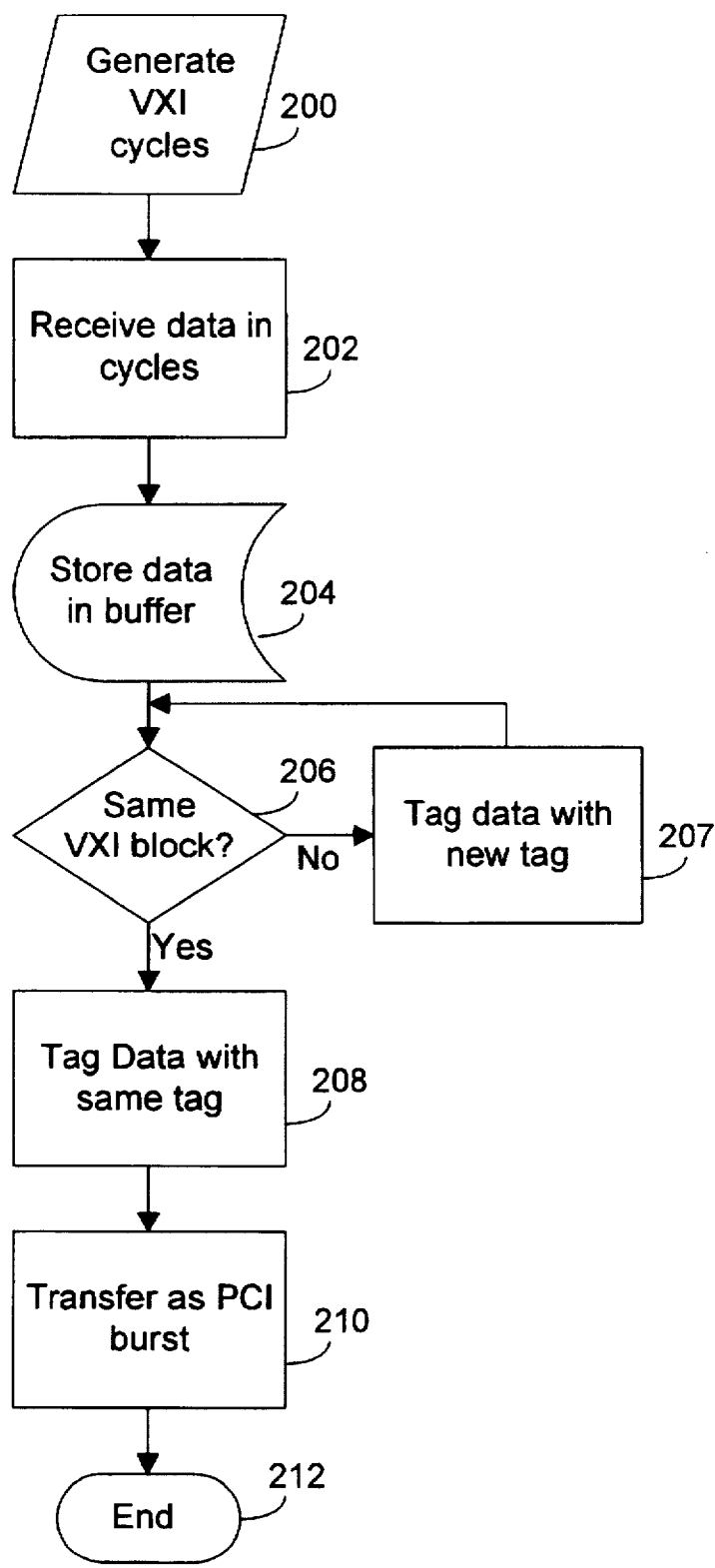
FIG. 3 illustrates a flow diagram of a method in accordance with the present invention.

FIG. 3 illustrates a flow chart of the operation of the system of FIG. 1 and FIG. 2. More particularly, a plurality of VXI block cycles, which correspond to one or more VXI block transfers is generated (Step 200). For example, a first block transfer may be initiated with an assertion of an address strobe and follow with data transfers. A second block transfer may immediately follow. The data from the first and second block transfers are received in a bus bridge (Step 202). The incoming data are stored in a buffer (Step 204). The incoming data are examined to determine whether they are part of a first or second block transfer. The bus bridge identifies, for example, using the address strobes that mark the beginning of each block transfer, whether each VXI block cycle is a part of the same VXI block transfer (Step 206). If so, a tag will be applied to the data (Step 208). Each tag may be a PCI address identifier. If the VXI block cycle is part of a next VXI block transfer, a new tag is applied (Step 207). The data having the same tag are then transferred along the PCI bus as a PCI burst cycle (Step 210). Thus, the data identified with the first tag as being part of the first VXI block cycle are transferred together as part of the same PCI burst cycle. The data identified with the second tag as being part of a subsequent VXI block cycle are transferred together as part of a second PCI burst cycle.

Although the system and method of the present invention has been described in connection with the preferred embodiment, it is not intended to be limited to the specific form set forth herein, but on the contrary, it is intended to cover such alternatives, modifications, and equivalents as can reasonably be included within the spirit and scope of the invention as defined by the appended claims.

I claim:

1. A method of converting VXI block transfer cycles to PCI burst cycles in a system including a VXI bus and a PCI bus, comprising:

generating a plurality of VXI block cycles which transfer data on the VXI bus, wherein said plurality of VXI block cycles use a block transfer protocol, wherein said data transferred on said plurality of VXI block cycles are asynchronous and are transferred at a variable rate, wherein said plurality of VXI block cycles includes first block cycles comprising first data and corresponding to a first block transfer, and wherein said plurality of VXI block cycles includes second block cycles comprising second data corresponding to a second block transfer;

receiving said plurality of VXI block cycles from the VXI bus;

capturing said data from the plurality of VXI block cycles in a buffer;

examining said captured data from the plurality of VXI block cycles to determine which of said captured data from the plurality of VXI block cycles is part of said first block transfer and said second block transfer;

tagging the captured first data from the plurality of VXI block cycles with a first identifier in response to determining that the captured first data are part of the first block transfer, wherein said first identifier identifies said first block transfer as one or more PCI bus burst transfers;

tagging the captured second data from the plurality of VXI block cycles with a second identifier in response to determining that the captured second data are part of the second block transfer, wherein said second identifier identifies said second block transfer as one or more PCI bus burst transfers;

transferring the captured first data from the plurality of VXI block cycles on the PCI bus using a first PCI burst cycles, wherein said transferring the captured first data utilizes said first identifier to identify the captured first data; and transferring the captured second data from the plurality of VXI block cycles on the PCI bus using a second PCI burst cycle, wherein said transferring the captured second data utilizes said second identifier to identify the captured second data.

2. The method of claim 1, wherein said plurality of VXI block cycles further include third block cycles comprising third data and corresponding to a third block transfer;

wherein said determining further comprises determining which of said captured data from the plurality of VXI block cycles are part of said third block transfer;

the method further comprising:

tagging the captured third data from the plurality of VXI block cycles with a third identifier in response to determining that the captured third data are part of the third block transfer, wherein said third identifier identifies said first block transfer as one or more PCI bus burst transfers; and transferring the captured third data from the plurality of VXI block cycles on the PCI bus using a third PCI burst cycle, wherein said transferring the captured third data utilizes said third identifier to identify the captured third data.

3. A method of converting VXI block transfer cycles to PCI burst cycles in a system including a VXI bus and a PCI bus, comprising:

generating a plurality of VXI block cycles which transfer data on the VXI bus, wherein said plurality of VXI block cycles use a block transfer protocol, wherein said plurality of VXI block cycles include two or more block transfers each comprising block cycles including respective data;

receiving said plurality of VXI block cycles from the VXI bus;

capturing said data from the plurality of VXI block cycles in a buffer;

examining said captured data from the plurality of VXI block cycles to determine which of said captured data from the plurality of VXI block cycles is part of respective ones of said two or more block cycles;

tagging the captured data from the plurality of VXI block cycles with respective identifiers corresponding to respective ones of said two or more block transfers in response to said examining, wherein said identifiers identify each of said two or more block transfers as one or more PCI bus burst transfers; and transferring the captured data from each of said two or more block transfers on the PCI bus using respective PCI burst cycles, wherein said transferring uses said respective identifiers to identify said captured data.

4. The method of claim 3, wherein said two or more block transfers include a first block transfer and a second block transfer;

wherein said first block transfer comprises fast block cycles including first data and wherein said second block transfer comprises second block cycles including second data;

wherein said tagging comprises:

tagging the first data corresponding to the first block transfer with a first identifier;

tagging the second data corresponding to the second block transfer with a second identifier;

wherein said transferring comprises:
    transferring the first data corresponding to the first block transfer on the PCI bus using a first PCI burst cycles, wherein said transferring the first data uses said first identifier to identify the first data; and
    transferring the second data corresponding to the second block transfer on the PCI bus using a second PCI burst cycle, wherein said transferring the first data uses said second.

5. The method of claim 1, wherein said examining said captured data comprises examining addresses of said captured data to determine which of said captured data from the plurality of VXI block cycles is part of said first block transfer and said second block transfer.

6. The method of claim 1, wherein said identifiers comprise address identifiers.

7. The method of claim 3, wherein said data transferred on said plurality of VXI block cycles is asynchronous and is transferred at a variable rate.

8. A method of converting block transfer cycles on a first bus to burst cycles on a second bus in a system including the first bus and the second bus, comprising:
    generating a plurality of block cycles which transfer data on the first bus, wherein said plurality of block cycles use a block transfer protocol, wherein said plurality of block cycles include first block cycles comprising first data and corresponding to a first block transfer, and wherein said plurality of block cycles include second block cycles comprising second data corresponding to a second block transfer;
    receiving said plurality of block cycles from the first bus;
    capturing said data from the plurality of block cycles in a buffer;
    examining said captured data from the plurality of block cycles to determine which of said captured data from the plurality of block cycles is part of said first block transfer or said second block transfer;
    tagging the captured first data from the plurality of block cycles with a first identifier in response to determining that the captured first data is part of the first block transfer, wherein said first identifier identifies said first block transfer as one or more PCI bus burst transfers;
    tagging the captured second data from the plurality of block cycles with a second identifier in response to determining that the captured second data is part of the second block transfer, wherein said second identifier identifies said second block transfer as one or more PCI bus burst transfers;
    transferring the captured first data from the plurality of block cycles on the second bus using a first burst cycle, wherein said transferring the captured first data uses said first identifier to identify the captured first data; and
    transferring the captured second data from the plurality of block cycles on the second bus using a second burst cycle, wherein said transferring the captured second data uses said second identifier to identify the captured second data.

9. The method of claim 8, wherein said plurality of block cycles further include third block cycles comprising third data and corresponding to a third block transfer;
    wherein said determining further comprises determining which of said captured data from the plurality of block cycles is part of said third block transfer;
    the method further comprising:
        tagging the captured third data from the plurality of block cycles with a third identifier in response to determining that the captured third data is part of the third block transfer, wherein said third identifier identifies said third block transfer as one or more PCI bus burst transfers; and
        transferring the captured third data from the plurality of block cycles on the second bus using a third burst cycle, wherein said transferring the captured third data uses said third identifier to identify the captured third data.

10. The method of claim 8, wherein said data transferred on said plurality of block cycles is asynchronous and is transferred at a variable rate.

11. A bus bridge for coupling to a VXI bus and a PCI bus for converting VXI block transfers on the VXI bus to burst transfers on the PCI bus, comprising:
    means for receiving a plurality of VXI block cycles from the VXI bus, wherein said plurality of VXI block cycles use a block transfer protocol, wherein said plurality of VXI block cycles include two or more block transfers each comprising block cycles including respective data;
    a buffer for capturing said data from the plurality of VXI block cycles;
    control logic which examines said captured data from the plurality of VXI block cycles and determines which of said captured data from the plurality of VXI block cycles is part of respective ones of said two or more block cycles;
    wherein said control logic tags the captured data from the plurality of VXI block cycles with respective identifiers corresponding to respective ones of said two or more block transfers, wherein said identifiers identify each of said two or more block transfers as one or more PCI bus burst transfers; and
    means for transferring the captured data from each of said two or more block transfers on the PCI bus using respective PCI burst cycles, wherein said means for transferring the captured data uses said respective identifiers to identify the captured data.

12. A bus bridge for coupling to a first bus and a second bus for converting block transfers on the first bus to burst transfers on the second bus, comprising:
    means for receiving a plurality of block cycles from the first bus, wherein said plurality of block cycles use a block transfer protocol, wherein said plurality of block cycles include two or more block transfers each comprising block cycles including respective data;
    a buffer for capturing said data from the plurality of block cycles;
    control logic which examines said captured data from the plurality of block cycles and determines which of said captured data from the plurality of block cycles is part of respective ones of said two or more block cycles;
    wherein said control logic tags the captured data from the plurality of block cycles with respective identifiers corresponding to respective ones of said two or more block transfers, wherein said identifiers identify each of said two or more block transfers as one or more PCI bus burst transfers; and
    means for transferring the captured data from each of said two or more block transfers on the second bus using respective burst cycles, wherein said means for transferring the captured data uses said respective identifiers to identify the captured data.

13. The bus bridge of claim 12, wherein said first bus is a VXI bus and said plurality of block cycles are VXI block cycles.

14. The bus bridge of claim 12, wherein said second bus is a PCI bus and said burst cycles comprise PCI burst cycles.

15. A system which converts between VXI block cycles and PCI burst cycles, comprising:

a VXI bus;

a VXI bus device coupled to the VXI bus which generates a plurality of VXI block cycles on the VXI bus which transfer data on the VXI bus, wherein said plurality of VXI block cycles use a block transfer protocol, wherein said plurality of VXI block cycles include two or more block transfers each comprising block cycles including respective data;

a PCI bus;

a bus bridge coupled to the VXI bus and the PCI bus for converting VXI block transfers on the VXI bus to burst transfers on the PCI bus, the bus bridge comprising:

means for receiving said plurality of VXI block cycles from the VXI bus, wherein said plurality of VXI block cycles use a block transfer protocol, wherein said plurality of VXI block cycles include two or more block transfers each comprising block cycles including respective data;

a buffer for capturing said data from the plurality of VXI block cycles;

control logic which examines said captured data from the plurality of VXI block cycles and determines which of said captured data from the plurality of VXI block cycles is part of respective ones of said two or more block cycles;

wherein said control logic tags the captured data from the plurality of VXI block cycles with respective identifiers corresponding to respective ones of said two or more block transfers, wherein said identifiers identify each of said two or more block transfers as one or more PCI bus burst transfers; and means for transferring the captured data from each of said two or more block transfers on the PCI bus using respective PCI burst cycles, wherein said means for transferring the captured data uses said respective identifiers to identify the captured data; and a PCI device coupled to the PCI bus which receives said PCI burst cycles.

* * * * *

UNITED STATES PATENT AND TRADEMARK OFFICE
CERTIFICATE OF CORRECTION

PATENT NO. : 5,796,963

DATED : August 18, 1998

INVENTOR(S) : B. Keith Odom

It is certified that error appears in the above-identified patent and that said Letters Patent is hereby corrected as shown below:

Claim 4, col. 6, line 59, please delete "fast" and substitute "first".

Claim 4, col. 7, line 4, please delete "cycles" and substitute "cycle".

Claim 4, col. 6, line 9, please insert omitted words "identifier to identify the second data" after the word second and before the period.

Signed and Sealed this

Twenty-fourth Day of November, 1998

Attest:

BRUCE LEHMAN

Attesting Officer

Commissioner of Patents and Trademarks